US009326434B2

(12) United States Patent
Uesugi et al.

(10) Patent No.: US 9,326,434 B2
(45) Date of Patent: Apr. 26, 2016

(54) PARTS FEEDING DEVICE AND SURFACE MOUNTING MACHINE

(71) Applicant: YAMAHA HATSUDOKI KABUSHIKI KAISHA, Shizuoka (JP)

(72) Inventors: Akinobu Uesugi, Shizuoka (JP); Naoki Hanamura, Shizuoka (JP); Kenichi Indo, Shizuoka (JP); Toshimichi Satou, Shizouka (JP); Toshiyuki Kusunoki, Shizuoka (JP); Tomoharu Kurayama, Shizuoka (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 544 days.

(21) Appl. No.: 13/802,346

(22) Filed: Mar. 13, 2013

(65) Prior Publication Data

US 2013/0326867 A1    Dec. 12, 2013

(30) Foreign Application Priority Data

Jun. 8, 2012  (JP) .................................. 2012-130872

(51) Int. Cl.
  *B23P 19/00*   (2006.01)
  *H05K 13/04*   (2006.01)
  *B65H 5/28*    (2006.01)

(52) U.S. Cl.
  CPC ............... *H05K 13/043* (2013.01); *B65H 5/28* (2013.01); *H05K 13/0417* (2013.01); *Y10T 29/53022* (2015.01); *Y10T 29/53174* (2015.01)

(58) Field of Classification Search
  CPC ... H05K 13/043; H05K 13/0417; B65H 5/28; Y10T 29/53022; Y10T 29/5313; Y10T 29/53174; Y10T 29/53178; Y10T 29/53; Y10T 29/53013

USPC ........... 29/705, 700, 739, 729, 740, 741, 759, 29/834, 835, 836; 221/9, 10, 11, 70
See application file for complete search history.

(56) References Cited

U.S. PATENT DOCUMENTS 5,136,776 A    8/1992  Yanagisawa
2002/0124391 A1*  9/2002  Kawai ................ H05K 13/0417
                                                29/739

(Continued)

FOREIGN PATENT DOCUMENTS

CN    101507382 A    8/2009
JP    2000-261191 A    9/2000

(Continued)

OTHER PUBLICATIONS

An Office Action issued by the Korean Patent Office on Oct. 29, 2014, which corresponds to Korean Patent Application No. 10-2013-0039135 and is related to U.S. Appl. No. 13/802,346; with English language summary.

(Continued)

*Primary Examiner* — Peter DungBa Vo
*Assistant Examiner* — Azm Parvez
(74) *Attorney, Agent, or Firm* — Studebaker & Brackett PC

(57) ABSTRACT

A parts feeding device which is equipped in a surface mounting machine body includes a drive unit for feeding a parts feeding tape which houses parts, and a control unit for controlling the drive unit. The control unit includes a detection unit for detecting execution of work for removing the parts feeding device from the surface mounting machine body, and a pullback execution unit for causing the drive unit to execute a process of pulling back the parts feeding tape, which has become empty as a result of feeding the parts, when the execution of work for removing the parts feeding device is detected by the detection unit.

5 Claims, 13 Drawing Sheets

(56) References Cited

U.S. PATENT DOCUMENTS

| | | | |
|---|---|---|---|
| 2008/0093375 A1* | 4/2008 | Davis | H05K 13/0417 221/72 |
| 2010/0242267 A1 | 9/2010 | Tsukagoshi | |

FOREIGN PATENT DOCUMENTS

| | | |
|---|---|---|
| JP | 3329304 B2 | 9/2002 |
| JP | 2003-258493 A | 9/2003 |
| JP | 2009-238821 A | 10/2009 |
| JP | 2009-295829 A | 12/2009 |
| JP | 2011-181816 A | 9/2011 |
| KR | 10-0195560 B1 | 6/1999 |

OTHER PUBLICATIONS

An Office Action issued by the Korean Patent Office on Apr. 11, 2014, which corresponds to Korean Patent Application No. 10-2013-0039135 and is related to U.S. Appl. No. 13/802,346; with English language partial translation.

* cited by examiner

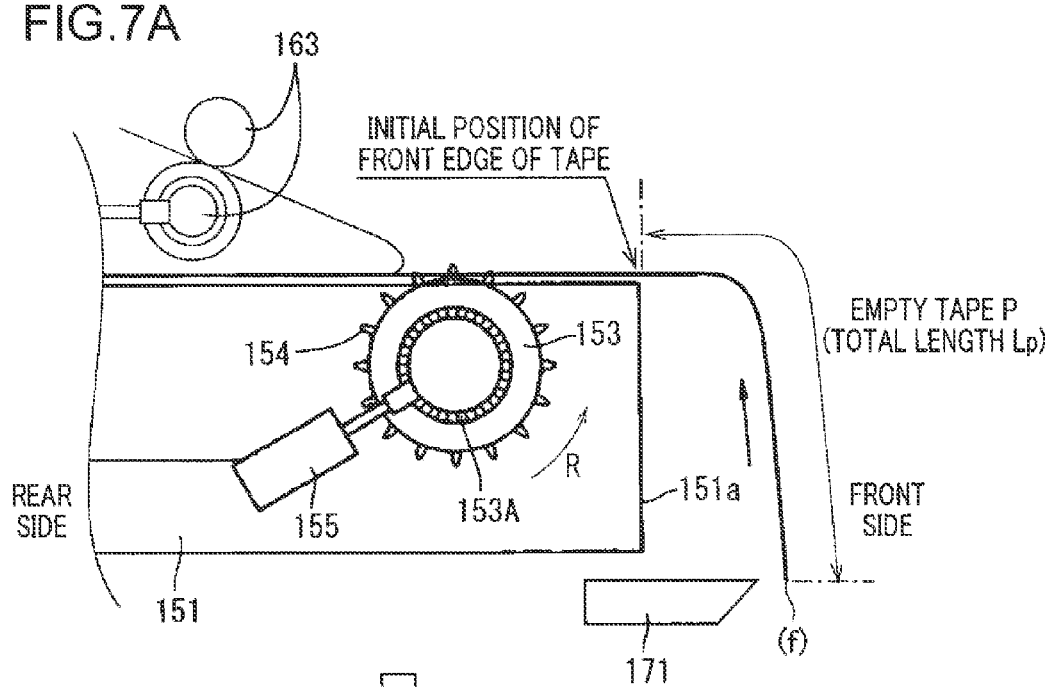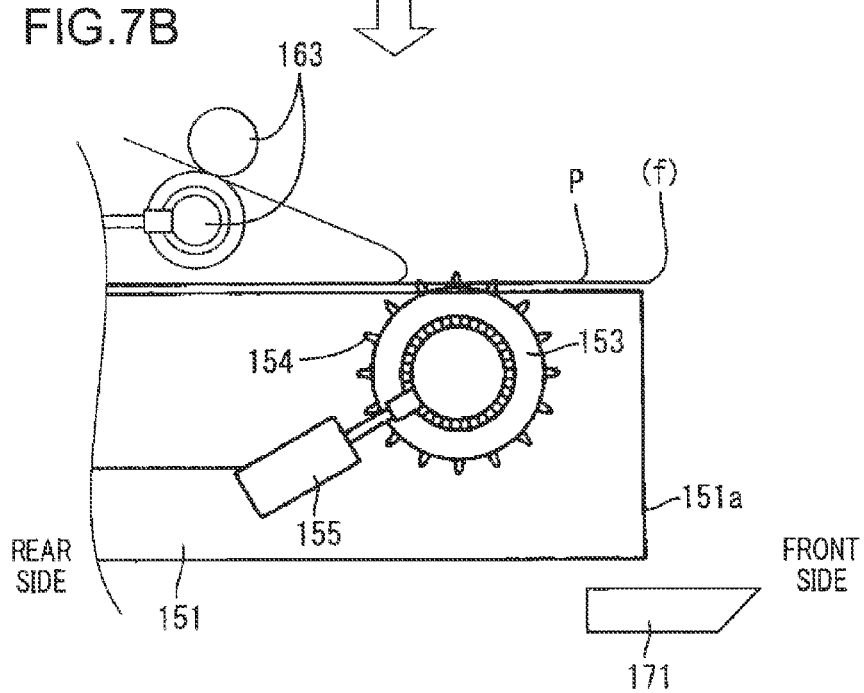

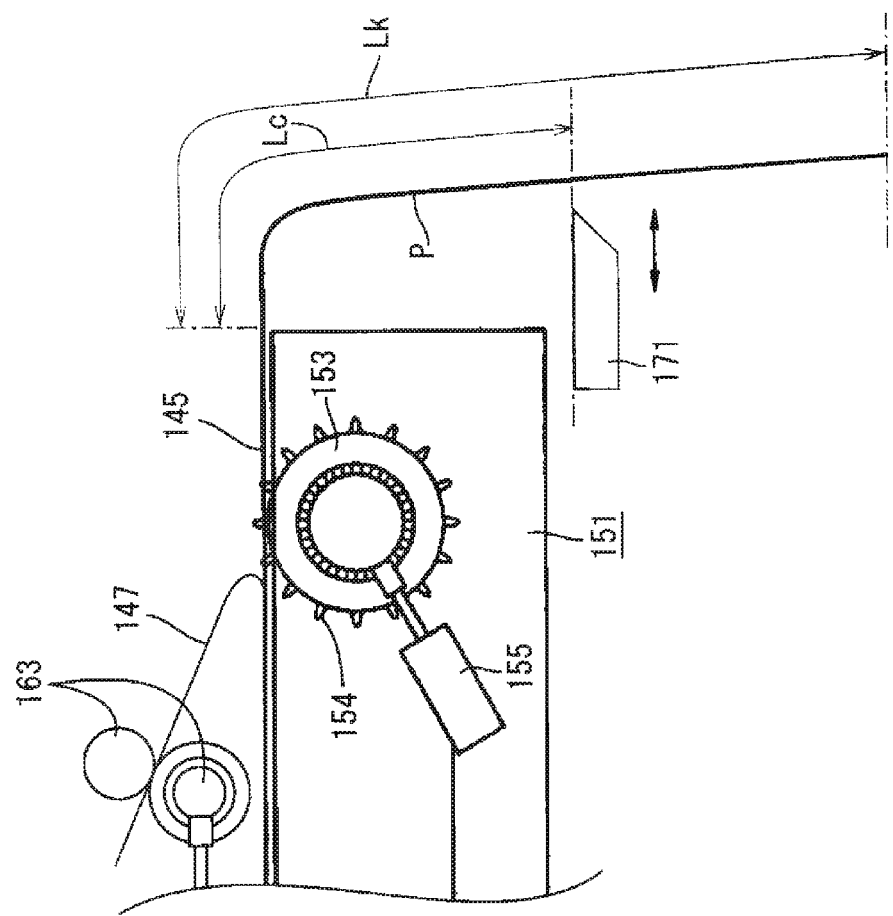

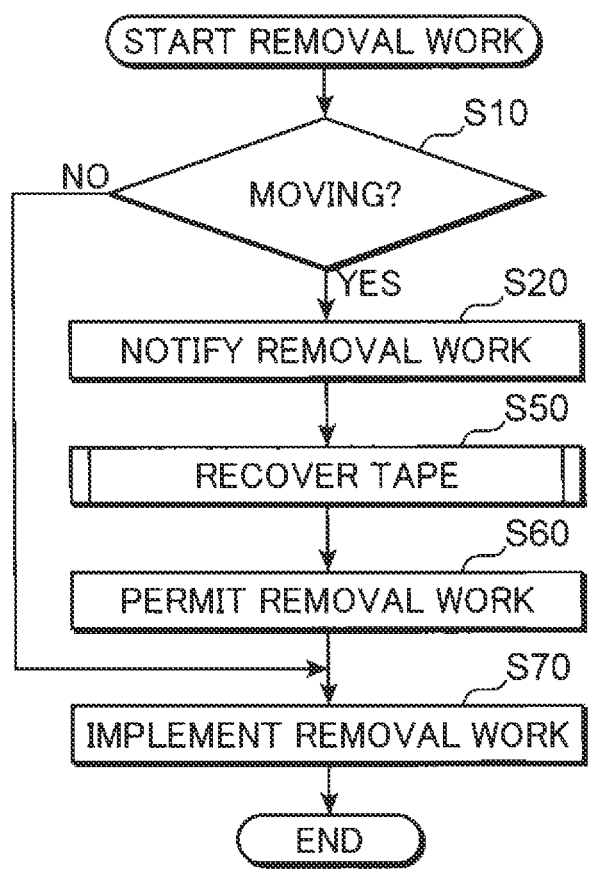

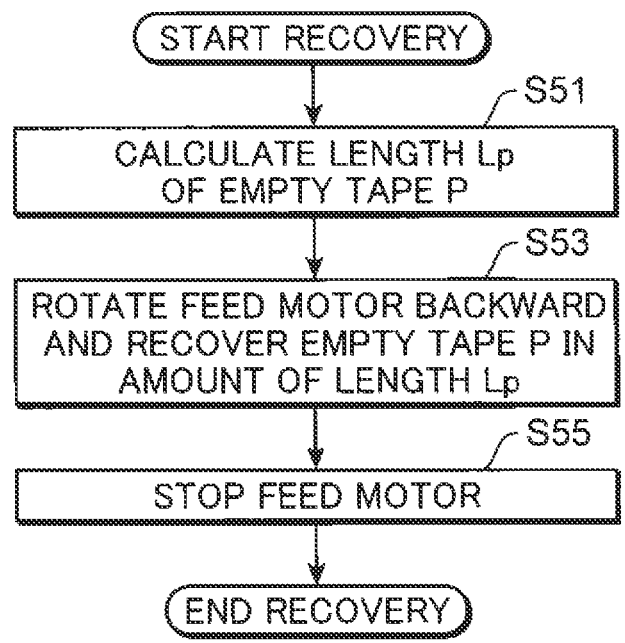

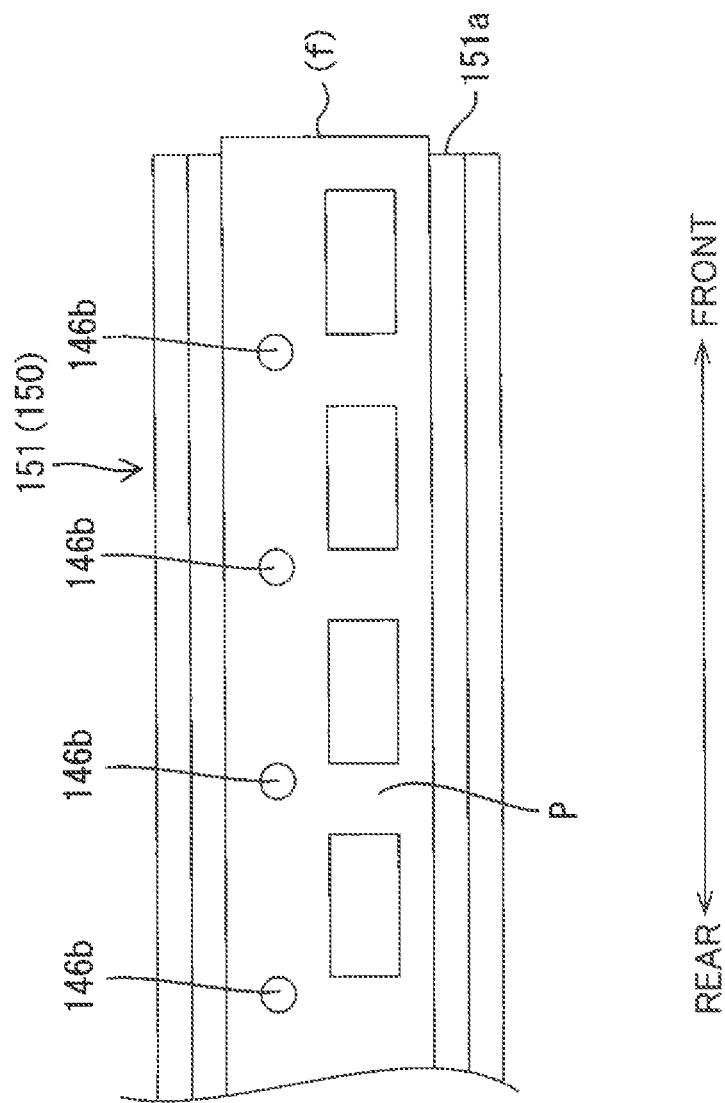

PARTS FEEDING DEVICE AND SURFACE MOUNTING MACHINE

BACKGROUND OF THE INVENTION

1. Field of the Invention

The present invention relates to a parts feeding device for feeding parts to a surface mounting machine body, and to a surface mounting machine to which the parts feeding device is applied.

2. Description of the Background Art

Conventionally, as one means which is equipped in a surface mounting machine to feed parts to be mounted, a parts feeding device, which is also referred to as a so-called tape feeder, is known. For example, the parts feeding device disclosed in Japanese Patent Application Publication No. 2009-295829 has a configuration in which a parts feeding tape, which houses a plenty of parts at regular intervals, is fed up to the parts extraction position ahead while being unwound from a reel loaded in the parts feeding device, and the mounting head provided to the surface mounting machine extracts the parts at the parts extraction position.

With a conventional device, when the parts feeding device is to be removed (extracted) from the surface mounting machine body for the replacement of the reel due to the shortage of parts or malfunction of the parts feeding device, the surface mounting machine body is temporarily stopped. However, in order to improve the mounting efficiency of parts, in recent years, there are cases where the surface mounting machine body is caused to continue operating, without stopping, upon removing the parts feeding device.

When the parts feeding device is removed while the surface mounting machine body is kept operating, the parts feeding tape that has become empty as a result of feeding the parts will flap around horizontally. The horizontally flapping tape sometimes extends to the motion space of the mounting head and becomes tangled with the mounting head. Therefore, improvements are being demanded.

SUMMARY OF THE INVENTION

An object of this invention is to prevent an empty tape, which results from the feeding of the parts, from extending to the motion space of the mounting head.

The parts feeding device according to one aspect of the present invention for achieving the foregoing object is a parts feeding device equipped in a surface mounting machine body including a drive unit for feeding a parts feeding tape which houses parts, and a control unit for controlling the drive unit. The control unit includes a detection unit for detecting execution of work for removing the parts feeding device from the surface mounting machine body, and a pullback execution unit for causing the drive unit to execute a process of pulling back the parts feeding tape, which has become empty as a result of feeding the parts, when the execution of work for removing the parts feeding device is detected by the detection unit.

Moreover, the surface mounting machine according to another aspect of the present invention includes a parts feeding device for feeding parts, and a surface mounting machine body to which the parts feeding device is loaded, and which receives the feeding of parts from the parts feeding device to thereby mount the parts on a printed circuit board, wherein the parts feeding device has the foregoing configuration.

BRIEF DESCRIPTION OF THE DRAWINGS

FIGS. 7A and 7B are diagrams showing the operation for recovering an empty tape;

FIG. 8 is a diagram showing the relation of the tape cut and the total length of the empty tape;

FIG. 9 is a flowchart showing the flow of removal work of the feeder;

FIG. 10 is a flowchart showing the recovery process of an empty tape;

FIG. 13 is a plan view (top view) of the front edge part of the feeder.

DESCRIPTION OF THE PREFERRED EMBODIMENTS

<Embodiment 1>

1. Overall Configuration of Surface Mounting Machine

Figure 1:
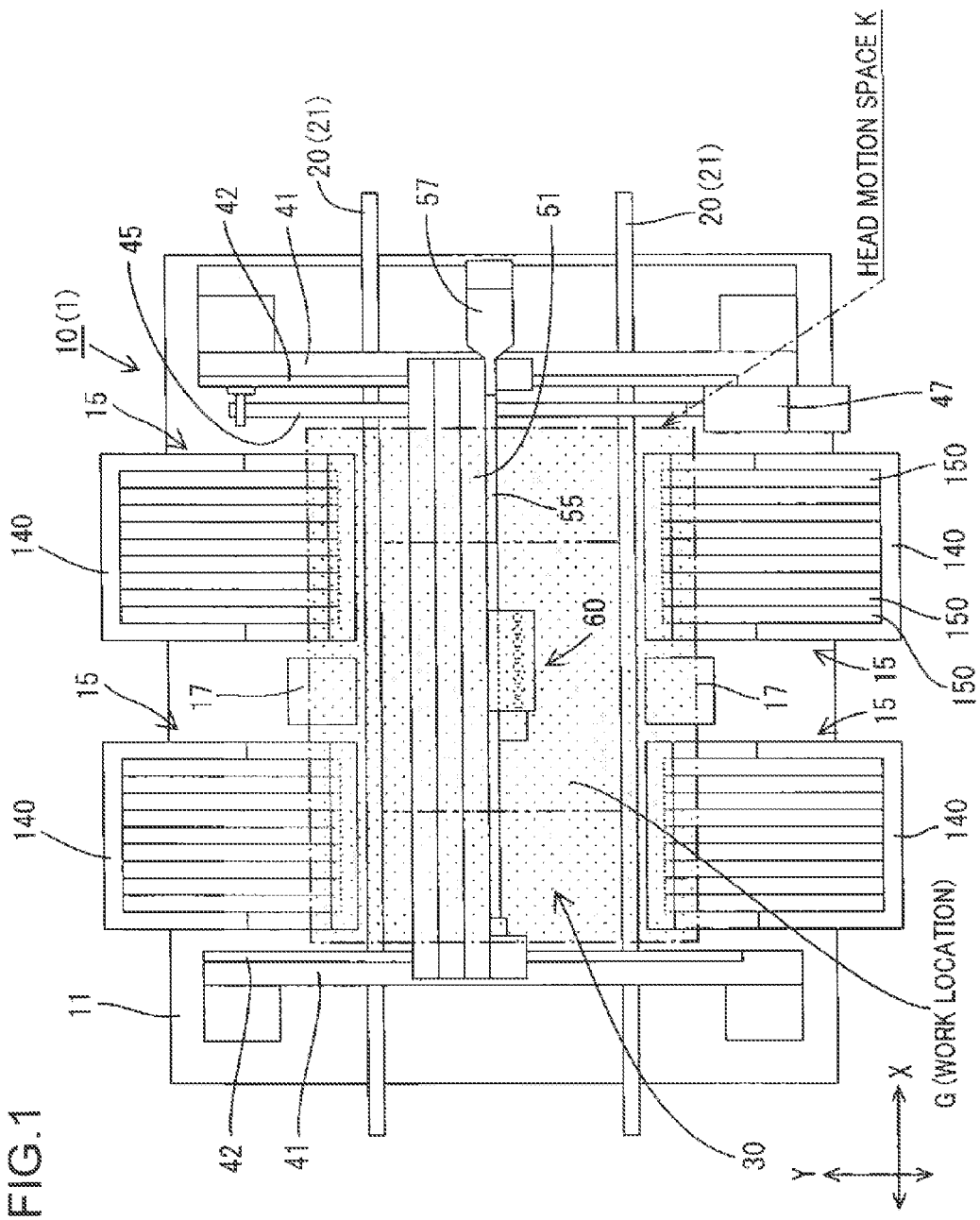
FIG. 1 is a plan view of the surface mounting machine according to Embodiment 1 of the present invention.
Figure 2:
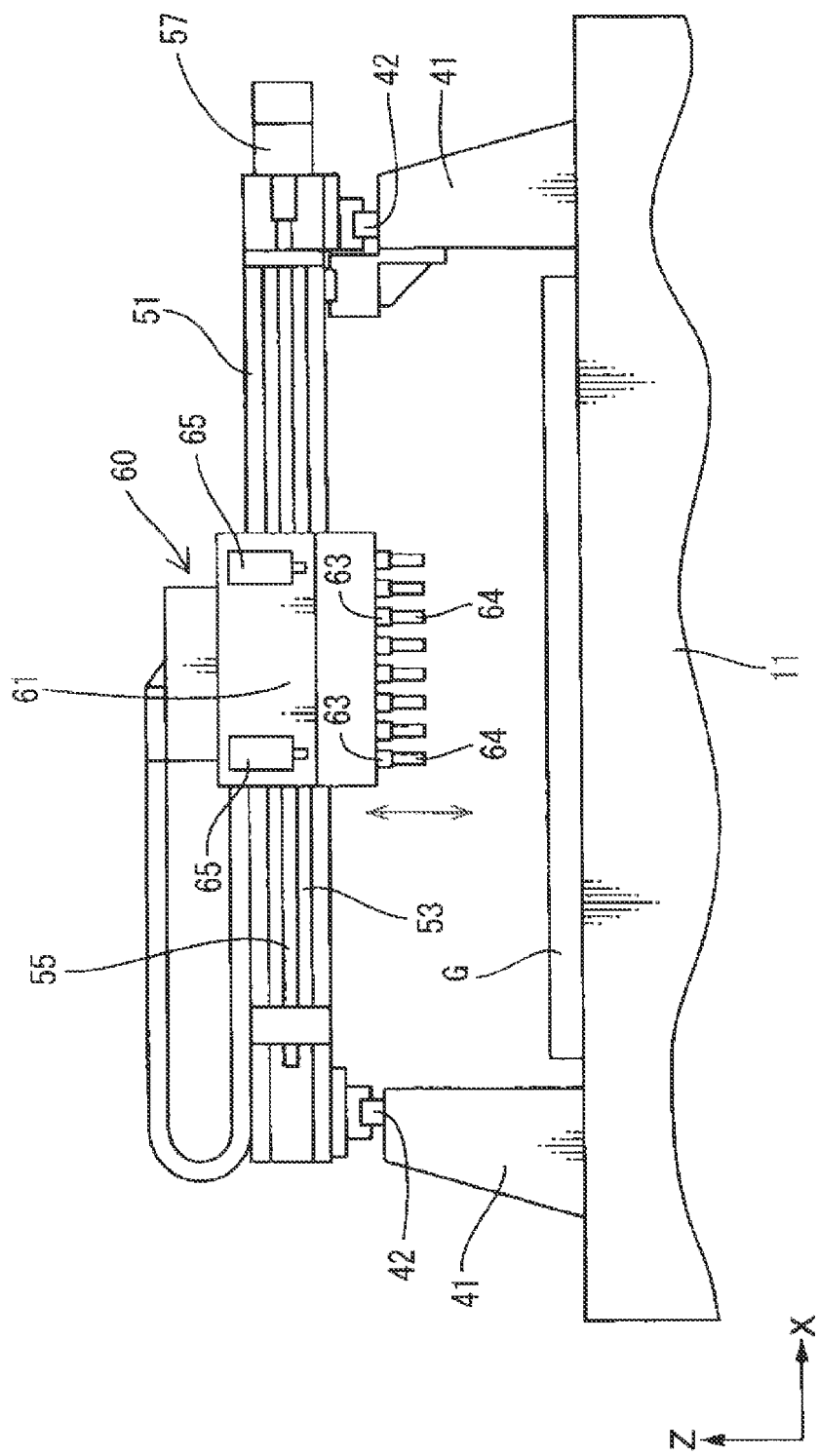
FIG. 2 is a partial enlarged view showing the support structure of the head unit.

FIG. 1 is a plan view of the surface mounting machine 1 according to Embodiment 1 of the present invention, and FIG. 2 is a partial enlarged view showing the support structure of the head unit. The surface mounting machine 1 includes a surface mounting machine body 10 and a feeder 150. The surface mounting machine body 10 includes a base 11 having a smooth top face, and is configured by various devices being disposed on the base 11. Moreover, a feeder 150 (parts feeding device) for feeding parts is equipped in the surface mounting machine body 10. Note that, in the ensuing explanation, the longitudinal direction (horizontal direction of FIG. 1) of the base 11 is referred to as the X direction, the depth direction (vertical direction of FIG. 1) of the base 11 is referred to as the Y direction, and the vertical direction of FIG. 2 is referred to as the Z direction.

A transfer conveyer (hereinafter also simply referred to as a "conveyer") 20 for transferring a printed circuit board is disposed at the center of the base 11. The transfer conveyer 20 includes a pair of transfer belts 21 that is circularly driven in the X direction. When the printed circuit board G is set to be installed across both transfer belts 21, the printed circuit board G on the top face of the belt is delivered in the drive direction of the transfer belts 21 due to the friction with the transfer belts 21.

In this Embodiment, the right side shown in FIG. 1 is the entry to the surface mounting machine 1, and the printed circuit board G is introduced into the surface mounting machine 1 through the conveyer 20 from the right side shown in FIG. 1. The introduced printed circuit board G is carried by the conveyer 20 to the work location (position shown with the dashed-two dotted line in FIG. 1) at the center of the base 11, and stops there.

The parts feeding unit 15 is provided at four places around the work location. Each parts feeding unit 15 is provided with a feeder mount board 140. A plurality of feeders 150 is horizontally mounted on each feeder mount board 140.

The surface mounting machine 1 additionally includes a parts loading device 30. The parts loading device 30 performs the mounting process of mounting, at the work location, the parts W fed through the feeder 150 on the printed circuit board G. After the mounting process is completed, the printed circuit board G is carried in the left direction of FIG. 1 through the conveyer 20, and carried outside the machine. The parts loading device 30 generally includes an X axis servo mechanism, a Y axis servo mechanism, a Z axis servo mechanism, and a mounting head 63 that is driven in the X axis, Y axis, and Z axis directions by the foregoing servo mechanisms.

The surface mounting machine 1 includes a pair of supporting legs 41, a guide rail 42 and a head support 51 for the parts loading device 30. The pair of supporting legs 41 is arranged on the base 11. Both supporting legs 41 are positioned on either side of the work location, and both extend linearly in the Y direction. The guide rail 42 is placed on the top face of the respective supporting legs 41, and extends in the Y direction. The head support 51 is mounted on the pair of supporting legs 41 as a result of the bottom face of the end thereof in the longitudinal direction being fitted with the left and right guide rails 42.

A Y axis ball screw 45 extending in the Y direction is attached to the right-side supporting leg 41, and a ball nut (not shown) is additionally threadably mounted on the Y axis ball screw 45. A Y axis motor 47 is attached along the Y axis ball screw 45. When the Y axis motor 47 is driven, as a result of the ball nut moving along the Y axis ball screw 45, the head support 51 fixed to the ball nut, and the head unit 60 described subsequently, move in the Y direction along the guide rail 42 (Y axis servo mechanism).

A guide member 53 extending in the X direction is provided to the head support 51. A head unit 60 is mounted on the guide member 53 in a manner of being freely movable along the axis of the guide member 53. An X axis ball screw 55 extending in the X direction is mounted on the head support 51, and a ball nut (not shown) is additionally threadably mounted on the X axis ball screw 55. An X axis motor 57 is attached along the X axis ball screw 55. When the X axis motor 57 is driven, as a result of the ball nut moving along the X axis ball screw 55, the head unit 60 fixed to the ball nut moves in the X direction along the guide member 53 (X axis servo mechanism).

As a result of integrally controlling the foregoing X axis servo mechanism and the Y axis servo mechanism, the head unit 60 can be operated to move in the horizontal direction (XY direction) on the base 11. In other words, the mounting head 63 explained below can be arbitrarily moved within the head motion space K (shown with a dashed line frame in FIG. 1) on the base 11.

A plurality of mounting heads 63 for performing the mounting operation are loaded in the head unit 60 in sequence. The mounting head 63 is protruding downward from the bottom face of the head unit 60, and an adsorption nozzle 64 is provided to the front edge thereof. Each mounting head 63 can be rotated around the axis based on the drive of the R axis motor 49 (FIG. 6), and lifted and lowered relative to the frame 61 of the head unit 60 based on the drive of the Z axis motor 48 (FIG. 6) (Z axis servo mechanism). Negative pressure is supplied to each adsorption nozzle 64 from a negative pressure device not shown. It is thereby possible to generate suction at the front edge of the head 63.

Since the surface mounting machine 1 includes the foregoing configuration, when the respective servo mechanisms of the X axis, the Y axis and the Z axis are operated at a prescribed timing, the mounting head 63 can extract the parts W fed through the feeder 150 from the parts feeding position A (FIG. 4) on the feeder 150 and mount such parts W on the printed circuit board G.

The surface mounting machine 1 additionally includes a parts recognition camera 17 (FIG. 1), and a printed board recognition camera 65 (corresponds to the "pullback detection unit" of the present invention). The parts recognition camera 17 captures an image of the parts W that were extracted by the mounting head 63, and detects the adsorption posture of the parts W. The printed board recognition camera 65 is fixed to the head unit 60 in a manner where the imaging face is facing downward, and moves integrally with the head unit 60. Consequently, as a result of driving the foregoing X axis servo mechanism and the Y axis servo mechanism, the image of an arbitrary position on the printed circuit board G in the work location can be captured by the printed board recognition camera 65.

2. Configuration of Parts Feeding Tape, Feeder and Empty Tape Cutting Device

Figure 3:
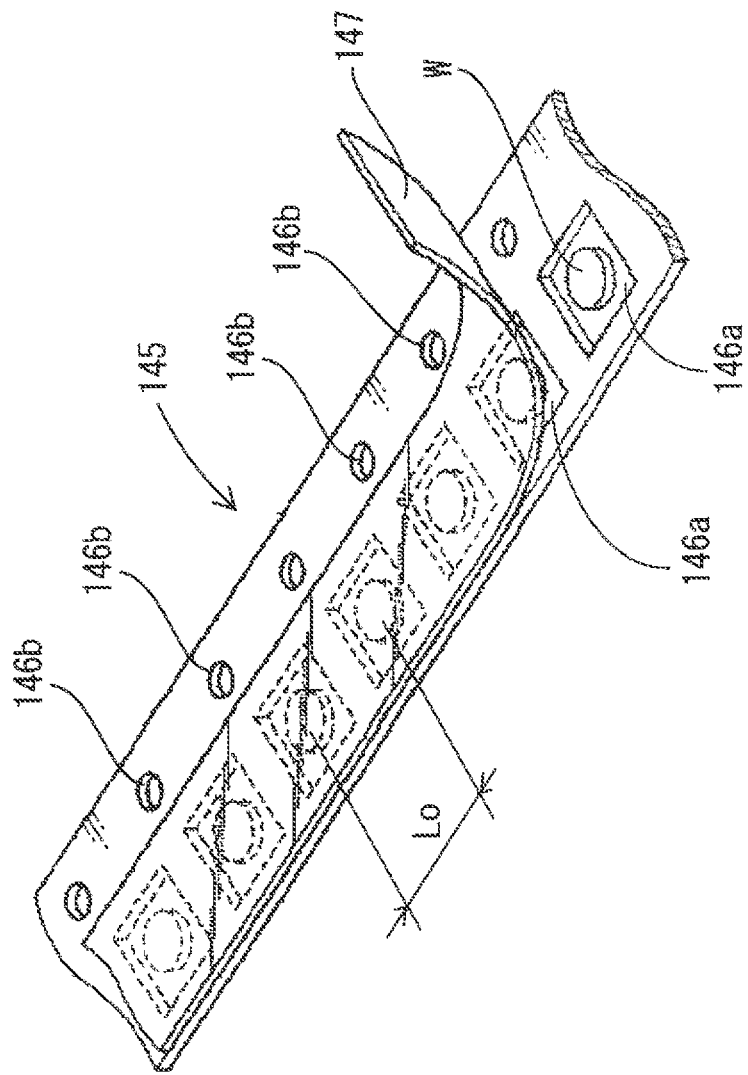
FIG. 3 is a perspective view of the parts feeding tape.

The parts feeding tape 145 which functions as a carrier for retaining the parts is foremost explained, and the configuration of the feeder 150 and the empty tape cutting device 170 will be subsequently explained. As shown in FIG. 3, the parts feeding tape 145 is of a sheet shape extending in one direction, and includes hollow parts housing units 146a, which are opened upward, at regular intervals (that is, feed pitch of the parts W) Lo. An engagement hole 146b penetrating in the vertical direction is provided to one side of each parts feeding tape 145. These engagement holes 146b are arranged at regular intervals. Each parts housing unit 146a houses one part W such as an IC chip, and a cover tape 147 is attached to the top face of the parts feeding tape 145 so as to seal the parts housing units 146a. The parts feeding tape 145 is wound around a reel R (FIG. 4), and one end thereof is unwound from the reel R.

Figure 4:
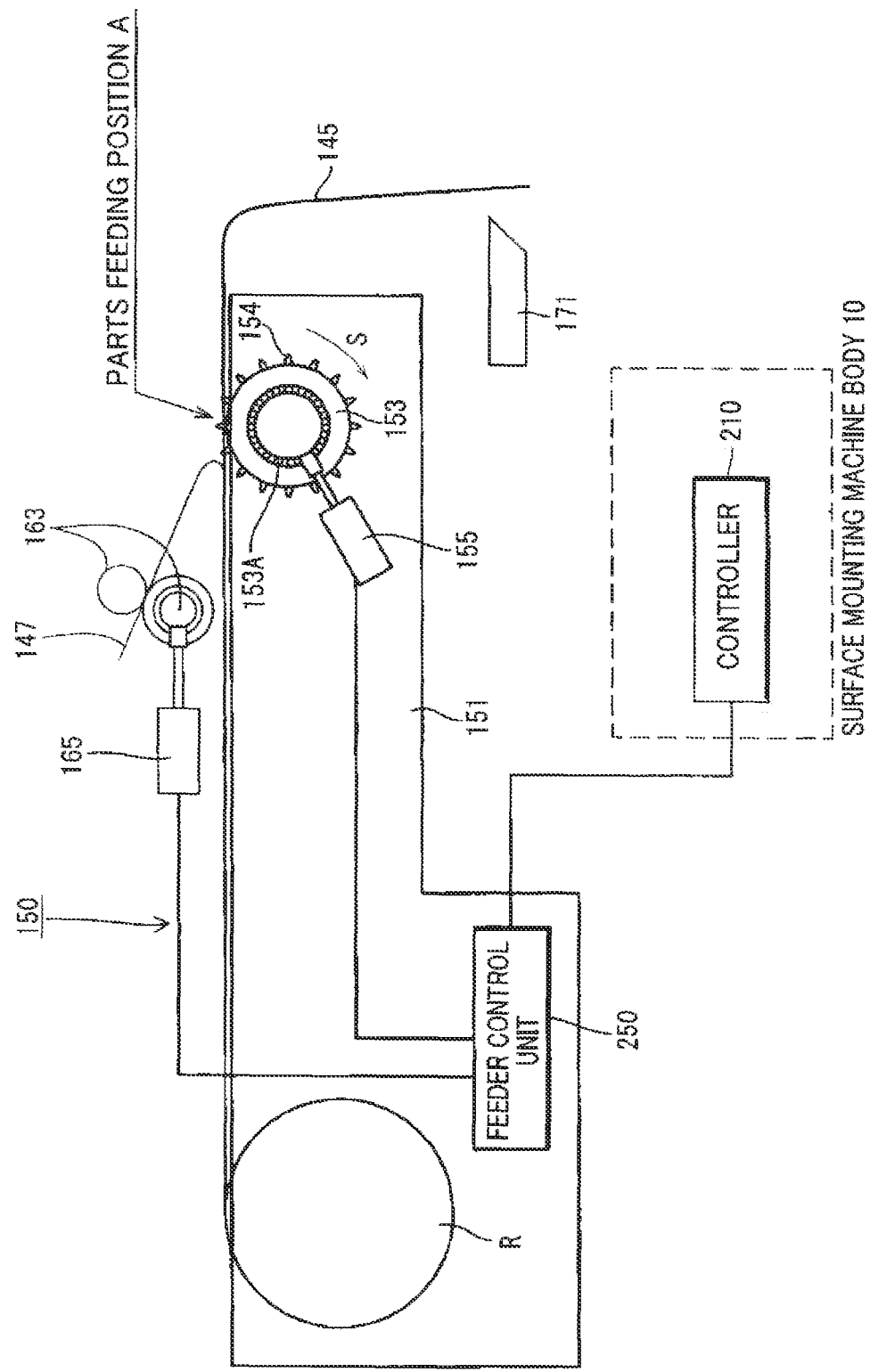
FIG. 4 is a side view showing the configuration of the feeder body.

Referring to FIG. 4, the feeder 150 includes a sprocket 153, a feed motor 155 (drive unit) for rotating the sprocket 153 and unwinding the parts feeding tape 145, a collection roller 163 for collecting the cover tape 147, a pullback motor 165 for rotating the collection roller 163, and a base part 151 to which the foregoing components are installed. The base part 151 is of an elongated shape in its longitudinal direction, and the reel R around which the parts feeding tape 145 is wound is fixed to the rear side thereof. The top face part of the base part 151 functions as the tape passage of the parts feeding tape 145 unwound from the reel R.

The sprocket 153 is rotatably mounted to the front part of the base part 151. A drive gear 153A is integrally formed on the side face of the sprocket 153, and a motor gear on the side of the feed motor 155 engages with the drive gear 153A. Engagement teeth 154 are provided to the outer peripheral face of the sprocket 153 at even intervals. Each engagement tooth 154 engages with each engagement hole 146b of the parts feeding tape 145. Accordingly, when the feed motor 155 is powered and driven, the sprocket 153 rotates in the forward direction (rotation in the S direction shown in FIG. 4), and transfers the parts feeding tape 145 toward the parts feeding position A set at the front part of the feeder 150. Specifically, the feed motor 155 pitch-feeds the parts feeding tape 145 based on the feed pitch Lo of the parts W.

The cover tape 147 is peeled backward from the parts feeding table 145 in front of the parts feeding position A, and collected by the collection roller 163. After the cover tape 147 is peeled, since the parts W housed in the parts housing unit 146a become exposed, the parts W can be extracted by the mounting head 63 at the parts feeding position A.

Figure 5:
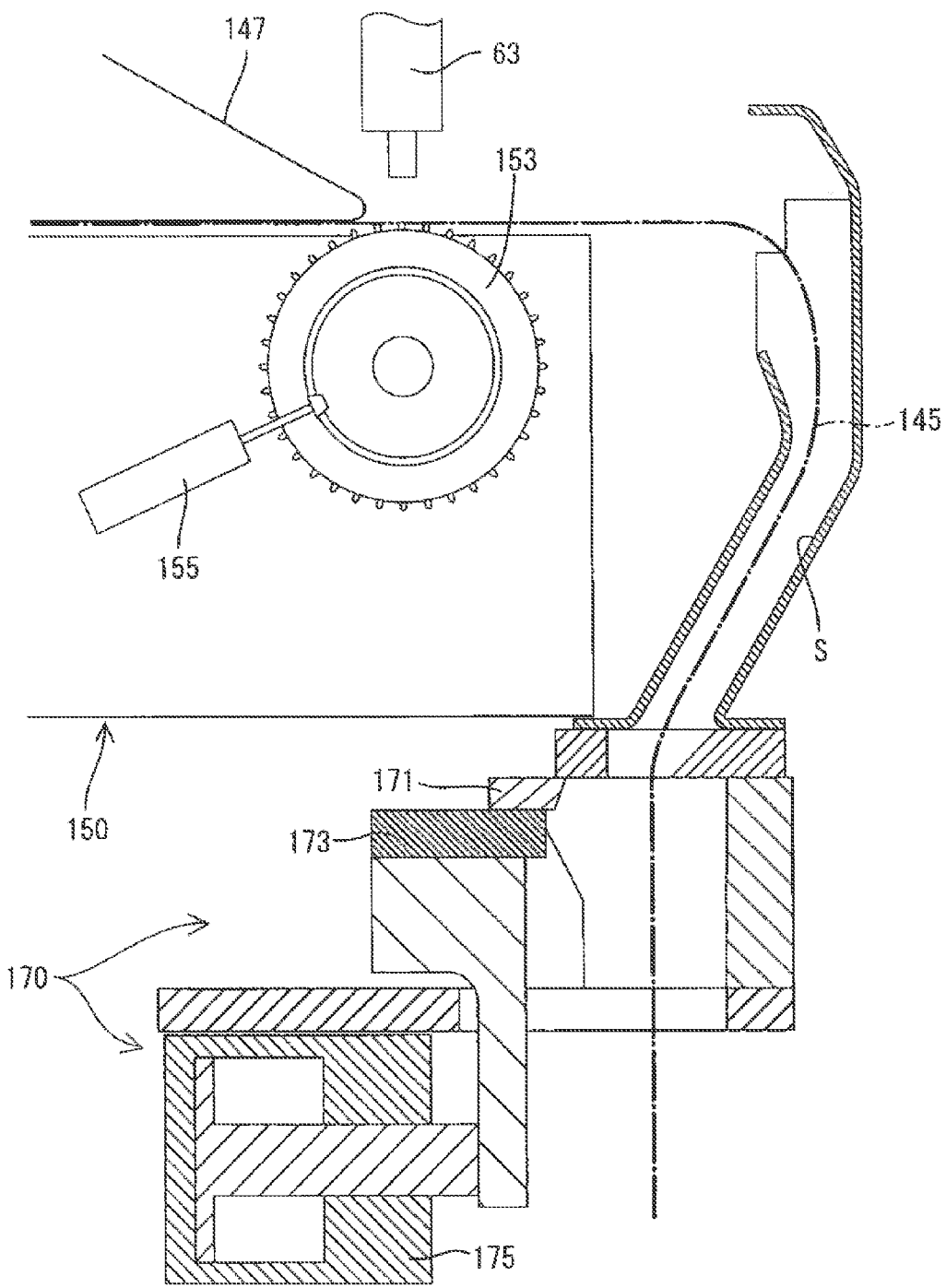
FIG. 5 is a cross section showing the configuration of the empty tape cutting device.

The empty parts feeding tape 145 from which the parts W were extracted passes through a chute S provided to the parts feeding unit 15 and is guided to the lower front part of the feeder 150 as shown in FIG. 5. Moreover, an empty tape cutting device 170 is mounted at the exit of the chute S.

The empty tape cutting device 170 includes a cutting blade 171 mounted at the chute exit, and a drive unit (cylinder) 175. The cutting blade 171 is fixed to the front part of the top face of the movable plate 173. When the cylinder 175 is operated, the movable plate 173 reciprocates in the horizontal direction. Accordingly, the parts feeding tape 145 protruding downward from the exit of the chute S can be cut with the cutting blade 171. Note that, in this Embodiment, the empty tape is cut by the cutting blade 171 when the total length of the empty tape P exceeds a cut value Lk (refer to FIG. 8).

3. Electrical Configuration of Surface Mounting Machine

Figure 6:
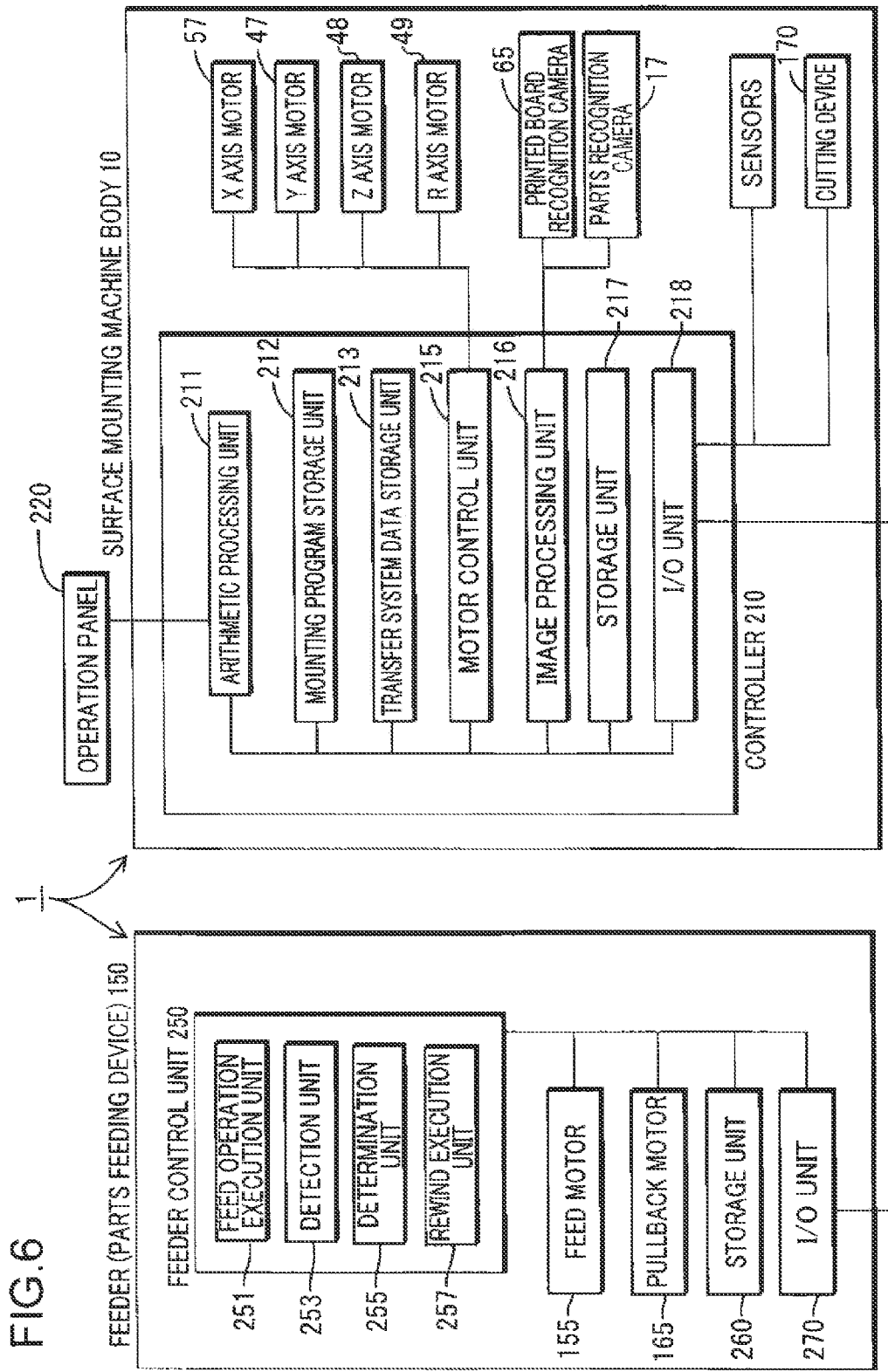
FIG. 6 is a block diagram showing the electrical configuration of the surface mounting machine.

The electrical configuration of the surface mounting machine 1 is now explained with reference to FIG. 6. The controller 210 governs the control of the overall surface mounting machine body 10. In addition to an arithmetic processing unit 211 configured from a CPU or the like, the controller 210 functionally includes a mounting program storage unit 212, a transfer system data storage unit 213, a motor control unit 215, an image processing unit 216, a storage unit 217 and an I/O unit 218. An operation panel 220 is connected to the arithmetic processing unit 211, and various input operations are enabled via the operation panel 220.

The mounting program storage unit 212 stores a mounting program for controlling the servo mechanism configured from an X axis motor 57, a Y axis motor 47, a Z axis motor 48, an R axis motor 49, and so on. The transfer system data storage unit 213 stores data for controlling a transfer system such as the transfer conveyer 20.

The motor control unit 215 drives the various motors together with the arithmetic processing unit 211 according to the mounting program. Various motors are electrically connected to the motor control unit 215.

The parts recognition camera 17 and the printed board recognition camera 65 are electrically connected to the image processing unit 216, and the imaging signals output from the respective cameras 17, 65 are respectively loaded. The image processing unit 216 analyzes the parts image and analyzes the printed board image based on the loaded imaging signals. The storage unit 217 stores the mounting program, and the data required for executing the empty tape recovery sequence described later.

The I/O unit 218 is a so-called interface, and is used for sending and receiving control signals to and from the feeder 150, as well as for loading the detection signals output from the various sensors provided to the surface mounting machine body 10. Moreover, the empty tape cutting device 170 is connected to the I/O unit 218, and the cutting of the empty tape P by the empty tape cutting device 170 is carried out based on commands from the arithmetic processing unit 211 provided to the controller 210.

The feeder 150 includes a feeder control unit (corresponds to the "control unit" of the present invention) 250, a feed motor 155, a pullback motor 165, a storage unit 260 and an I/O unit 270. The feeder control unit 250 includes a feed operation execution unit 251, a detection unit 253, a determination unit 255 and a rewind execution unit 257 (pullback execution unit).

The feed operation execution unit 251 executes the pitch-feeding operation (operation of unwinding the parts feeding tape) of the parts W toward the parts feeding position A by coordinating with the arithmetic processing unit 211 of the mounting machine body 10 and controlling the rotation and stop of the feed motor 155 and the pullback motor 165.

The detection unit 253, the determination unit 255, and the rewind execution unit 257 are provided for performing the recovery of the empty tape P explained next. The detection unit 253 fulfills the function for detection of executing the work for removing the feeder 150 from the surface mounting machine body 10. The determination unit 255 fulfills the function of determining the length Lp of the empty tape P. The rewind execution unit 257 fulfils the function of executing the process of rewinding the empty tape P in the amount of the determined length Lp when the execution of the work for removing the feeder 150 is detected.

The storage unit 260 is configured from a non-volatile memory such as EEPROM or NVRAM. The I/O unit 270 is a so-called interface, and is connected, via a signal wire, with the I/O unit 218 provided to the mounting machine body 10.

4. Recovery of Empty Tape P

With a conventional device, when the feeder 150 is to be removed from the parts feeding unit 15 for the replacement of the reel due to the shortage of parts or malfunction of the parts feeding unit 15, the surface mounting machine body 10 is temporarily stopped. Nevertheless, in order to improve the mounting efficiency of parts, in recent years, there are cases where the surface mounting machine body 10 is caused to continue operating, without stopping, upon removing the feeder 150 from the parts feeding unit 15. When the feeder 150 is removed while the surface mounting machine body 10 is operating, the empty parts feeding tape 145 that arises as a result of feeding the parts W will flap around horizontally and would sometimes extend to the head motion space K and become tangled with the mounting head 63, and improvements are being demanded.

Thus, in this Embodiment, when the feeder 150 is to be removed from the surface mounting machine body 10, as a result of rotating the feed motor 155 of the feeder 150 backward and rotating the sprocket 153 in the opposite direction, the process (pullback process) of rewinding the parts feeding tape (empty tape) P that has become empty as a result of feeding the parts is executed. In other words, as shown in FIG. 7A, the empty tape P hanging downward from the front of the base part 151 is rewound backward to achieve a state where the empty tape P is not hanging; that is, the front edge (f) of the empty tape P is caused to basically coincide with the front edge of the base part 151 (refer to FIG. 7B). As a result of rewinding the empty tape P as described above, it is possible to prevent the empty tape P from extending to the head motion space K of the surface mounting machine body 10.

The length Lp of the empty tape P is now explained. The empty tape P arises as a result of feeding the parts W. Thus, the length "Lp" of the empty tape P can be calculated with the following Formula (1) when the number of parts W that have been fed is "N" and the feed pitch of the parts W is "Lo (refer to FIG. 3)".

$$Lp = N \times Lo \qquad \text{Formula (1)}$$

In this Embodiment, the controller 210 of the surface mounting machine body 10 manages the data regarding the number of parts W that have been fed and the data regarding the feed pitch of the parts W with respect to each feeder 150, and stores such data in the storage unit 217. When the feeder 150 is to be removed from the parts feeding unit 15, the length Lp of the empty tape P of the removed feeder 150 is calculated by the arithmetic processing unit 211 (functional part which functions as the "determination unit" of the claims) of the surface mounting machine body 10 based on the foregoing Formula (1). This calculation result is notified to the feeder 150. The feeder 150 is thereby able to recognize the length Lp of the empty tape P.

Moreover, in this Embodiment, as shown in FIG. 8, the front edge of the empty tape P is cut by the cutting blade 171 when the total length Lp of the empty tape P exceeds the cut value Lk. When the parts W are fed after the tape cut, the total length Lp of the empty tape P becomes longer than the time of the foregoing tape cut in the length that the parts W have been fed. Thus, the total length "Lp" of the empty tape when a tape cut was performed can be calculated with the following Formula (2) when the total length of the empty tape P at the time of tape cut is "Lc", the number of parts W that have been fed after the tape cut is "M", and the feed pitch of the parts W is "Lo".

$$Lp=Lc+M\times Lo \qquad \text{Formula (2)}$$

The controller 210 of the surface mounting machine body 10 also manages and stores data regarding the execution/non-execution of a tape cut, the total length Lc of the empty tape P at the time of tape cut, and the number of parts W that have been fed after the tape cut with respect to each feeder 150. Accordingly, when a tape cut is executed, the arithmetic processing unit 211 calculates the length Lp of the empty tape P based on the Formula (2).

5. Removal Work Procedure (Extraction Work Procedure) of Feeder

The removal work procedure of the feeder 150 is now explained with reference to FIG. 9 and FIG. 10. Upon removing the feeder 150, when the surface mounting machine body 10 is operating (S10: YES), the worker performs an operation of notifying the surface mounting machine body 10 of the removal work of the feeder 150 (S20). Specifically, the operation panel 220 provided to the surface mounting machine body 10 accepts the input of the indication of intent to perform the removal work of the feeder 150 and the number of the feeder 150 to be removed.

The notification of the removal work is communicated from the surface mounting machine body 10 to the feeder 150 to be removed, and received by the detection unit 253 of the feeder control unit 250. As a result of receiving the removal work notice, the detection unit 253 detects that the removal work of the feeder 150 from the surface mounting machine body 10 will be executed.

When the detection unit 253 detects the execution of the removal work of the feeder 150, the detection unit 253 notifies the information thereof to the rewind execution unit 257. Consequently, the process of recovering the empty tape P of the feeder 150 to be removed is executed by the rewind execution unit 257 of the feeder 150 (S50). The tape recovery process of S50 shown in FIG. 9 is configured from the three processing steps of S51 to S55 shown in FIG. 10.

In S51, the processing of calculating the length Lp of the empty tape P of the designated feeder 150 is performed by the arithmetic processing unit 211 of the surface mounting machine body 10. Subsequently, the calculated length Lp of the empty tape P is notified from the surface mounting machine body 10 to the rewind execution unit 257 of the feeder 150.

Note that the length of the empty tape P can be calculated so as long as information regarding the number of parts W that have been fed, the feed pitch Lo of the parts W, and the tape cut by the empty tape cutting device 170 is available. Accordingly, it is also possible to send the necessary data from the surface mounting machine body 10 to the feeder 150 and calculate the length of the empty tape P using the determination unit 255 of the feeder control unit 250. In the foregoing case, the length Lp of the empty tape will be notified from the determination unit 255 to the rewind execution unit 257.

When the rewind execution unit 257 of the feeder 150 acquires the data regarding the length Lp of the empty tape P, the rewind execution unit 257 causes the feed motor 155 to rotate in the opposite direction (S53). Consequently, since the sprocket 153 will rotate in the opposite direction (R direction of FIG. 7), the empty tape P is wound around the sprocket 153, and recovered by the reel R (rewind process). When the feeder control unit 250 rotates the feed motor 155 backward for the required number of rotations to recover the empty tape P in the amount of "Lp", the feeder control unit 250 stops the feed motor 155 (S55).

It is thereby possible to recover nearly all of the empty tape P, and, after the recovery, the feeder 150 will achieve a state where the empty tape P is not hanging down; that is, a state where the front edge (f) of the empty tape P basically coincides with the front edge 151a of the base part 151 (refer to FIG. 7B).

Subsequently, when the process for recovering the empty tape P is completed, the completion of recovery is notified from the feeder 150 to the surface mounting machine body 10. Upon receiving the foregoing notice, the surface mounting machine body 10 displays a message allowing the removal of the designated feeder 150 on the display unit provided with the operation panel 220. For example, if the feeder 150 designated in S20 is "No. 3", character information to the effect of "No. 3 feeder may be removed" is displayed (S60).

Subsequently, the worker that viewed the display will remove the designated "No. 3" feeder 150. Here, since the empty tape P has been recovered, there is no possibility of the empty tape P extending to the head motion space K of the surface mounting machine body 10 and becoming tangled with the mounting head 63. Note that, when the surface mounting machine body 10 is not operating upon removing the feeder 150 (S10: NO), the processing from S20 to S60 is not performed. Thus, the removal work of the feeder 150 is performed without the empty tape P being recovered (S70).

6. Explanation of Effect

In this Embodiment, since the empty tape P that has become empty as a result of feeding the parts is rewound, it is possible to restrict the empty tape P from extending to the head motion space K upon removing the feeder 150. Thus, even if the feeder 150 is removed while the surface mounting machine body 10 is operating, the empty tape P will not become tangled with the mounting head 63 that is moving within the head motion space K. Moreover, since the length Lp of the empty tape P is obtained based on calculation, the number of parts can be reduced in comparison to cases of detecting whether or not the empty tape P has been rewound using a sensor or the like.

When the empty tape P is rewound, the rewinding amount of the tape is preferably stored in the storage unit 260 of the feeder 150. As a result of storing the rewinding amount of the tape, for instance, when remounting the removed feeder 150 on a different feeder mount board 140 of the same mounting machine, or on a different mounting machine, the cue of the parts feeding tape 145 can be performed simply by feeding the tape in the rewinding amount.

<Embodiment 2>

Figure 11:
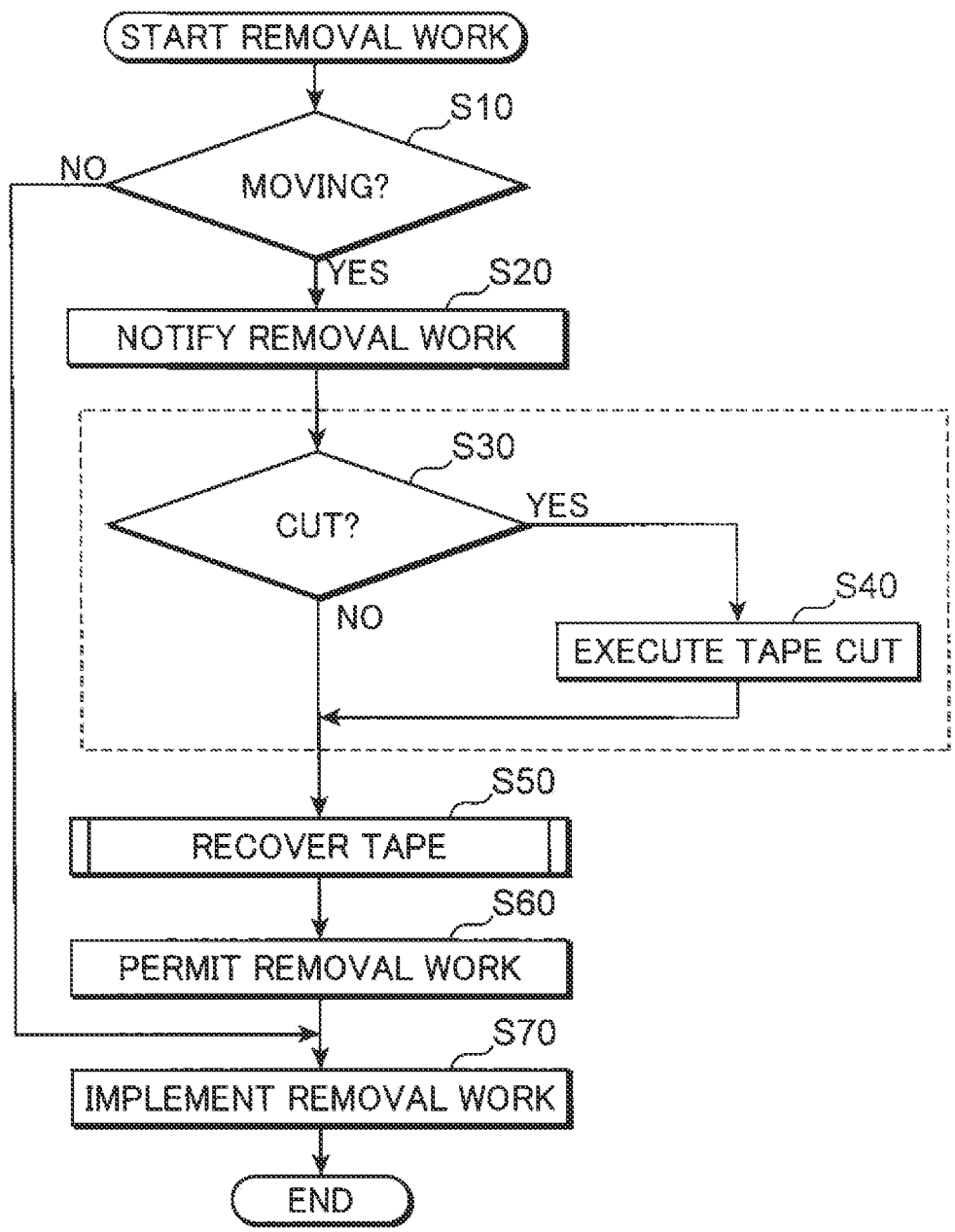
FIG. 11 is a flowchart showing the flow of removal work of the feeder according to Embodiment 2 of the present invention.

Embodiment 2 of the present invention is now explained with reference to FIG. 11. The surface mounting machine of Embodiment 2 differs from Embodiment 1 in that the removal work procedure of the feeder 150 has been partially changed, and the processing steps of S30 and S40 shown in FIG. 11 have been newly added (encompassed by a dashed line in the diagram). The newly added processing steps of S30 and S40 are performed for cutting the empty tape P in advance (S30, S40) and thereafter recovering the empty tape P upon removing the feeder 150 while the surface mounting machine body 10 is operating.

Whether to cut the empty tape P can be selected by the worker to perform the setting operation using the operation panel 220. When the worker has selected to cut the empty tape P, the determination is YES in S30, and the cutting of the empty tape P by the empty tape cutting device 170 is subsequently executed in S40. When the cutting of the empty tape P is executed, the length of the empty tape P becomes "Lc". Accordingly, in the foregoing case, there is no need to go through the trouble of calculating the total length of the empty tape P as in Embodiment 1, and it will suffice if the empty tape P is recovered in the amount of length "Lc" in the tape recovery process of S50.

<Embodiment 3>

Embodiment 3 of the present invention is now explained with reference to FIG. 12. In Embodiment 1, the length of the empty tape P was calculated upon recovering the empty tape P (S51). In Embodiment 3, in substitute for obtaining the length of the empty tape P, the empty tape P is rewound at predetermined pitches, and whether or not the rewinding of the empty tape P is complete is recognized from the image taken by the printed board recognition camera (corresponds to the "pullback detection unit" of the present invention) 65 mounted on the head unit 60.

Figure 12:
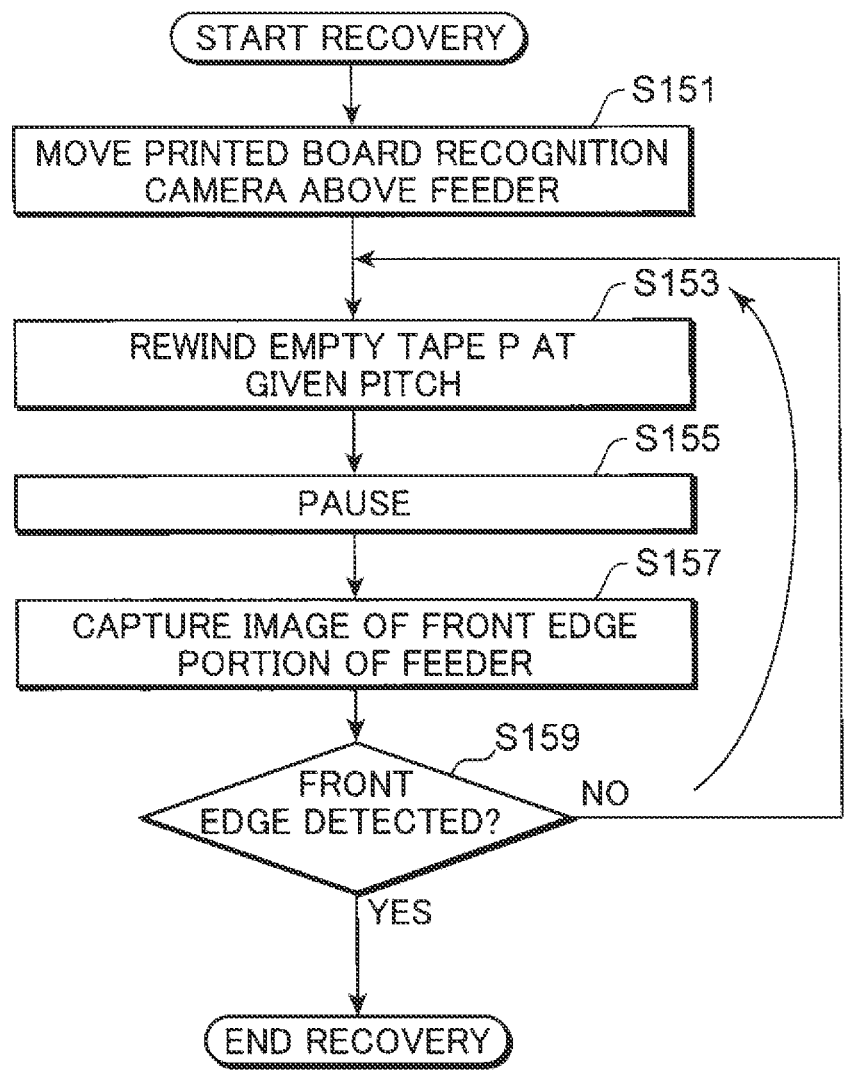
FIG. 12 is a flowchart showing the process for recovering an empty tape according to Embodiment 3 of the present invention.

In Embodiment 3, the tape recovery process of S50 of FIG. 9 is configured from the processing steps of S151 to S159 shown in FIG. 12. To explain this in order, foremost, in S151, the process of moving the printed board recognition camera 65 mounted on the head unit 60 to a position above the front end of the base part 151 of the feeder 150 to be removed is performed by the arithmetic processing unit 211.

Subsequently, the completion of the movement of the camera 65 is notified from the arithmetic processing unit 211 to the feeder 150. In S153, the feed motor 155 of the feeder 150 to be removed is rotated backward, and the process of rewinding the empty tape P at a predetermined pitch (for instance, 30 mm) is performed by the rewind execution unit 257 of the feeder control unit 250.

When the empty tape P is rewound a predetermined pitch, the rewinding is paused (S155). In this state, the printed board recognition camera 65 standing by above the feeder captures an image of the front part of the base part 151 of the feeder 150 (S157).

Subsequently, the processing of determining whether or not the captured image contains the front edge (f) of the empty tape P is performed by the arithmetic processing unit 211 (S159). When the front edge (f) of the empty tape P is not included in the image; that is, when the rewinding of the empty tape P is still midway, the determination is NO in S159.

When the determination is NO in S159, the routine subsequently returns to S153, and the empty tape P is additionally rewound by a predetermined pitch. When the empty tape P is rewound by a predetermined pitch, the printed board recognition camera 65 subsequently captures an image of the front part of the base part 151. Subsequently, the processing of determining whether or not the captured image contains the front edge (f) of the empty tape P is performed, and, when the front edge (f) of the empty tape P is not included in the captured image (S159), the routine once again returns to S153. In other words, the processing steps of S153 to S159 are repeatedly performed until the front edge (f) of the empty tape P is detected, and the empty tape P is rewound by a predetermined pitch at a time.

When the entire empty tape P is rewound, since the front edge (f) of the empty tape P will basically coincide with the front edge 151a of the base part 151 of the feeder 150, as shown in FIG. 13, the front edge (f) of the empty tape P can be detected from the camera image. Thus, when the determination processing of S159 is performed, the determination is YES. Consequently, the repetition loop of S153 to S159 exited, and the recovery work is ended. In other words, the rewind process of the empty tape P is ended on the condition that the rewinding of the empty tape P up to the front edge thereof is detected in the image.

According to Embodiment 3, since there is no need to go through the trouble of calculating the total length of the empty tape P as in Embodiment 1, the burden of the arithmetic processing unit 211 of the surface mounting machine body 10 can be alleviated. Moreover, in Embodiment 3, since the front edge (f) of the empty tape P is recognized by using the printed board recognition camera 65, there is an advantage in that the number of parts can be reduced in comparison to cases of recognizing the front edge (f) of the empty tape P by using a dedicated sensor or the like. Moreover, since the rewinding is ended upon detecting the front edge (f) of the empty tape P, the empty tape P can be reliably recovered.

<Other Embodiments>

The present invention is not limited to the Embodiments explained based on the foregoing descriptions and drawings and, for example, the following Embodiments are also covered by the technical scope of the present invention.

(1) Embodiment 1 explained a case where the length of the empty tape P was calculated using the arithmetic processing unit 211 of the surface mounting machine body 10. The length of the empty tape P can be calculated if there is data regarding the number of parts W that have been fed and the feed pitch Lo of the parts W. Accordingly, it is also possible to send such data from the surface mounting machine body 10 to the feeder 150 or other external equipment (for instance, a personal computer), and perform the calculation using the determination unit 255 of the feeder control unit 250 as described above, or using the external equipment.

(2) Embodiment 3 explained an example of detecting the front edge of the empty tape P by using the printed board recognition camera 65. Alternatively, a dedicated detection sensor may be provided for detecting the front edge of the empty tape P.

(3) Embodiment 1 explained an example of rewinding the empty tape P by rotating the feed motor 155 backward. Alternatively, a dedicated rewinding motor may be provided.

(4) The foregoing Embodiments explained an example of unwinding, from the reel R, the parts feeding tape 145 wound around the reel R by using the feed motor 155, and rewinding the parts feeding tape 145 (empty tape P) around the reel R by rotating the feed motor 155 backward. Alternatively, it is possible to configure the device so that a slackened part of the empty tape P can be formed between the reel R and the sprocket 153, and, upon causing the front edge (f) of the empty tape P to retreat, the slackened part may be formed simply by pulling back the empty tape P without rewinding the empty tape P around the reel R.

(5) The foregoing Embodiments illustrated the sprocket 153 and the feed motor 155 as the drive unit for unwinding and rewinding the parts feeding tape 145. The drive unit is not limited thereto and, for example, a roller pair capable of normal rotation and reverse rotation may also be used.

Note that the specific Embodiments described above mainly include the invention having the following configuration.

The parts feeding device according to one aspect of the present invention is a parts feeding device equipped in a surface mounting machine body including a drive unit for feeding a parts feeding tape which houses parts, and a control unit for controlling the drive unit. The control unit includes a detection unit for detecting execution of work for removing the parts feeding device from the surface mounting machine body, and a pullback execution unit for causing the drive unit to execute a process of pulling back the parts feeding tape, which has become empty as a result of feeding the parts, when the execution of work for removing the parts feeding device is detected by the detection unit.

According to the foregoing configuration, since the parts feeding tape (empty tape) which has become empty as a result of feeding the parts is rewound, it is possible to restrict the protrusion of the empty tape upon removing the parts feeding device from the surface mounting machine body.

In the foregoing configuration, preferably, the parts feeding tape is wound around a reel, the drive unit is a feed motor, and the pullback execution unit is a rewind execution unit for causing the drive unit to execute a process of rewinding the empty parts feeding tape.

According to the foregoing configuration, the feeding and pullback of the parts feeding tape can be executed easily based on the unwinding and rewinding of the parts feeding tape from the reel.

In the foregoing configuration, preferably, the control unit includes a determination unit for determining a length of an empty portion of the tape, which has become empty as a result of feeding the parts, from data regarding a feed pitch of the parts and the number of parts that have been fed, and the rewind execution unit rewinds the parts feeding tape in an amount of the determined length. According to the foregoing configuration, since the length of the empty tape is calculated, the number of parts can be reduced in comparison to cases of detecting whether or not the empty tape has been rewound using a sensor or the like.

Moreover, preferably, the rewind execution unit rewinds the parts feeding tape, which has become empty as a result of feeding the parts, by rotating the feed motor backward. According to the foregoing configuration, since the empty tape is rewound using a feed motor, the number of parts can be reduced in comparison to cases of providing a dedicated motor for the rewinding process.

The surface mounting machine according to another aspect of the present invention includes a parts feeding device for feeding parts, and a surface mounting machine body to which the parts feeding device is equipped, and which receives the feeding of parts from the parts feeding device to thereby mount the parts on a printed circuit board. The parts feeding device includes a drive unit for feeding a parts feeding tape which houses parts, and a control unit for controlling the drive unit. The control unit includes a detection unit for detecting execution of work for removing the parts feeding device from the surface mounting machine body, and a pullback execution unit for causing the drive unit to execute a process of pulling back the parts feeding tape, which has become empty as a result of feeding the parts, when the execution of work for removing the parts feeding device is detected by the detection unit.

In the foregoing case, preferably, the surface mounting machine further includes a pullback detection unit for detecting whether or not the parts feeding tape, which has become empty as a result of feeding the parts, has been rewound such that a front edge thereof returns to a front end of the parts feeding device, and the rewind execution unit ends the process of rewinding the parts feeding tape on the condition that the rewinding of the parts feeding tape up to the front edge thereof is detected by the pullback detection unit. According to the foregoing configuration, the empty tape can be reliably recovered since the rewinding process is ended by detecting the front edge of the empty tape.

As explained above, according to the present invention, protrusion of the empty tape relative to the motion space of the mounting head can be restricted. Thus, even when the parts feeding device is removed during the operation of the surface mounting machine body, the empty tape will not become tangled with the mounting head.

This application is based on Japanese Patent application No. 2012-130872 filed in Japan Patent Office on Jun. 8, 2012, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A parts feeding device equipped in a surface mounting machine body, comprising:
    a feed motor for feeding a parts feeding tape which houses parts and is wound around a reel; and
    a control unit for controlling the feed motor, the control unit including:
        a detection unit for detecting execution of work for removing the parts feeding device from the surface mounting machine body; and
        a rewind execution unit for causing the feed motor to execute a process of rewinding the parts feeding tape, which has become empty as a result of feeding the parts, when the execution of work for removing the parts feeding device is detected by the detection unit, wherein
    the control unit includes a determination unit for determining a length of an empty portion of the tape, which has become empty as a result of feeding the parts, from data regarding a feed pitch of the parts and the number of parts that have been fed, and
    the rewind execution unit rewinds the parts feeding tape in an amount of the determined length.

2. The parts feeding device according to claim 1, wherein the rewind execution unit rewinds the parts feeding tape, which has become empty as a result of feeding the parts, by rotating the feed motor backward.

3. A surface mounting machine, comprising:
a parts feeding device for feeding parts; and
a surface mounting machine body to which the parts feeding device is equipped, and which receives the feeding of parts from the parts feeding device to thereby mount the parts on a printed circuit board, wherein
the parts feeding device includes:
    a feed motor for feeding a parts feeding tape which houses parts and is wound around a reel; and
    a control unit for controlling the feed motor, the control unit including:
        a detection unit for detecting execution of work for removing the parts feeding device from the surface mounting machine body; and
        a rewind execution unit for causing the feed motor to execute a process of rewinding the parts feeding tape, which has become empty as a result of feeding the parts, when the execution of work for removing the parts feeding device is detected by the detection unit wherein the control unit includes a determination unit for determining a length of an empty portion of the tape, which has become empty as a result of feeding the parts, from data regarding a feed pitch of the parts and the number of parts that have been fed, and the rewind execution unit rewinds the parts feeding tape in an amount of the determined length.

4. The surface mounting machine according to claim 3, further comprising:

a pullback detection unit for detecting whether or not the parts feeding tape, which has become empty as a result of feeding the parts, has been rewound such that a front edge thereof returns to a front end of the parts feeding device, wherein the rewind execution unit ends the process of rewinding the parts feeding tape on a condition that the rewinding of the parts feeding tape up to the front edge thereof is detected by the pullback detection unit.

5. The surface mounting machine according to claim 3, wherein the rewind execution unit rewinds the parts feeding tape, which has become empty as a result of feeding the parts, by rotating the feed motor backward.

* * * * *